United States Patent [19]
Weng

[11] Patent Number: 5,265,104
[45] Date of Patent: Nov. 23, 1993

[54] DATA STORAGE SYSTEM INCLUDING REDUNDANT STORAGE DEVICES

[75] Inventor: Lih-Jyh Weng, Lexington, Mass.

[73] Assignee: Digital Equipment Corp., Maynard, Mass.

[21] Appl. No.: 618,179

[22] Filed: Nov. 26, 1990

[51] Int. Cl.$^5$ .................. G06F 11/10; H03M 13/00
[52] U.S. Cl. .................. 371/40.1; 371/37.8; 371/37.1
[58] Field of Search ............ 371/40.1, 37.5, 37.8, 371/37.1, 39.1

[56] References Cited

U.S. PATENT DOCUMENTS

| | | | |
|---|---|---|---|
| 4,413,339 | 11/1983 | Riggle et al. | 371/40.1 |
| 5,077,736 | 12/1991 | Dunphy, Jr. et al. | 371/40.1 |
| 5,134,619 | 7/1992 | Henson et al. | 371/40.1 |

Primary Examiner—Robert W. Beausoliel, Jr.
Assistant Examiner—Trink Tu
Attorney, Agent, or Firm—Cesari and McKenna

[57] ABSTRACT

A data storage system including k data drives and n-k redundant drives performs a write operation to a designated sector on a data drive by (i) retrieving from each of the other data drives the data stored in a corresponding sector, (ii) encoding the symbols stored in corresponding storage locations using an (n,k) distance D Reed-Solomon code to generate, for each set of k symbols, n-k redundancy symbols, and (iii) recording the generated symbols in the corresponding storage locations on each of the redundant drives. When the system next performs a write operation directed to the designated sector or one of the corresponding sectors on the other data drives, the system records the data on the appropriate sector and simultaneously records the same data in a corresponding sector on one of the redundant drives. The system continues writing to these sectors and associated redundant drives without performing retrieval and encoding operations, until the corresponding sectors on [(n-k)/2]-1 different data drives have been involved in write operations. When the system next performs a write operation directed to a corresponding sector on another data drive, the system retrieves the corresponding data from all k data drives, encodes the symbols in corresponding storage locations to generate redundancy symbols and stores the redundancy symbols in the corresponding storage locations on the redundant drives.

13 Claims, 3 Drawing Sheets

DATA STORAGE SYSTEM INCLUDING REDUNDANT STORAGE DEVICES

FIELD OF THE INVENTION

The invention relates generally to data storage systems which use redundant data storage devices to protect stored data from loss.

BACKGROUND OF THE INVENTION

The importance of error correction coding of data in digital computer systems has increased greatly as the density of the data recorded on a mass storage medium, more particularly a magnetic disk or tape, has increased. With higher recording densities, a tiny imperfection in the medium can corrupt a large amount of data. In order to avoid losing that data, error correction codes ("ECC's") are employed to, as the name implies, correct the erroneous data.

Before a string of data symbols is recorded, it is mathematically encoded to form redundancy symbols. The redundancy symbols are then appended to the data string to form code words—data symbols plus redundancy symbols. The code words are then stored on the storage medium. When the stored data is to be accessed, the code words containing the data symbols are retrieved from the storage medium and mathematically decoded. During decoding any errors in the data are detected and, if possible, corrected through manipulation of the redundancy symbols [For a detailed description of decoding see Peterson and Weldon, *Error-Correcting Codes*, 2d Edition, MIT Press, 1972].

In order to further protect the stored data from loss due, for example, to the corruption of a relatively large section of the storage medium or a complete shut down, or failure, of the storage device, some data storage systems store a copy of the data on a redundant data drive. The storage devices are herein referred to collectively as drives. If a particular data drive in the system becomes corrupted or fails, such that most or all of the data stored thereon can not be retrieved, the system furnishes to a requesting user the copy of the data which is stored on the redundant drive. The system is thus extremely robust, as it loses data only when both a data drive and its associated redundant drive fail. In order to achieve such robustness, however, the system requires, for a given amount of data, twice the data storage capacity of a non-redundant system.

In order to reduce the storage overhead, from one redundant drive for every data drive to one redundant drive for every "n" data drives, a known system exclusive-OR's the corresponding symbols of the data code words stored on n data drives and records the resulting "XOR-symbols" on an associated redundant drive. If one of the data drives fails, the system regenerates the data symbols which were stored thereon by exclusive-OR'ing the symbols recorded on the other n-1 data drives with the XOR-symbols stored on the redundant drive. The system thus loses data only when two or more of the n+1 drives simultaneously fail. Such a system is relatively robust, but not as robust as the duplicate system described above.

Further, the system trades storage overhead for speed. As part of every write operation to a designated drive, the system must (i) retrieve the corresponding symbols from the other data drives, (ii) exclusive-OR the retrieved data symbols with the corresponding new data symbols to be recorded, and (iii) record on the associated redundant drive the resulting XOR-symbols. The system must, also, record the new symbols on the designated data drive. Accordingly, each write operation involves three extra relatively time consuming steps.

A scheme for reducing the number of required redundant drives while retaining the robustness of the duplicate system has been proposed. The system encodes the stored data using an (n,k) distance "D" Reed-Solomon code, and thus, protects the data stored on k data drives using n-k redundant drives. Basically, before the system records a data code word in a designated sector on a particular data drive, the system first retrieves the data code words stored in the same sector location on each of the other data drives. Next, the system encodes, using the Reed-Solomon code, the corresponding symbols from each of the k-1 retrieved code words and the code word to be recorded and generates for each set of k symbols n-k redundancy symbols. The system thus encodes the first symbols from each of these code words and generates a first set of n-k redundancy symbols, and next, encodes the second symbols from each of the code words and generates a second set of n-k redundancy symbols, and so forth. Each set of n-k redundancy symbols and the associated k encoded symbols together form a code word in the Reed-Solomon code.

The system next records the various sets of n-k redundancy symbols on the n-k redundant drives, by recording one symbol from each set, that is, one symbol from each Reed-Solomon code word, on each drive. The first of the n-k redundant drives thus has stored on it the $k+1^{st}$ symbol from each Reed-Solomon code word, the second redundant drive has stored on it the $k+2^{nd}$ redundancy symbol from each Reed-Solomon code word, and so forth.

If a drive thereafter fails, the system can regenerate the data stored thereon using the associated Reed-Solomon code words. The system retrieves from each of the other drives the data and redundancy symbols which form the associated Reed-Solomon code words. The system then manipulates these code words, using conventional error correcting techniques, and basically fills in the otherwise lost symbols. Such a system can thus regenerate lost, or irretrievable, symbols even if up to D-1 drives fail simultaneously. Accordingly, the system is extremely robust.

This system, however, has the same drawback as the XOR-system described above, namely, each write operation includes the steps of (i) retrieving corresponding symbols from each of the data drives, (ii) encoding the retrieved symbols and the symbols to be recorded to generate redundancy symbols, and (iii) recording the generated redundancy symbols on the various redundant drives. Each write operation thus includes the same three extra steps.

The length of time the system takes to write data to a drive limits the speed with which data can be transferred to the system. A system which is robust, has low storage overhead and can perform write operations relatively quickly is desirable.

SUMMARY

The inventive system uses an (n,k) distance D Reed-Solomon code to generate, for each data code word symbol to be recorded, n-k redundancy symbols. It then records the n-k redundancy symbols on n-k redundant drives. Thereafter, as explained below, the system can perform at least $[(n-k)/2]-1$ write operations before it must again encode the "corresponding" data code word symbols to generate new redundancy symbols, where corresponding symbols are those located in the same, or corresponding, storage location on each of the drives. The system thus requires in its write operations fewer retrieval and encoding steps than known or proposed redundant storage systems. This system loses some error correction capacity for each write operation performed without the retrieval and encoding steps. However, the system still maintains redundant protection for each drive.

At the start of a write operation to a designated sector on a designated data drive, the system encodes the corresponding data code word symbols from the k data drives, $d_1, d_2, \ldots, d_k$, to generate, for each set of k symbols, a set of n-k redundancy symbols. It then stores the generated redundancy symbols in corresponding locations on the n-k redundant drives, $r_1, r_2, \ldots, r_{n-k}$.

When the system next performs a write operation directed to the designated sector or one of the corresponding sectors on the other data drives the system simultaneously records the new data code word in the appropriate sector on one of the k data drives, for example, sector 100 of drive $d_5$, and in a corresponding sector on one of the n-k redundant data drives, for example, sector 100 of drive $r_1$. The newly recorded symbols on drive $d_5$ are then protected from loss by the duplicate symbols on drive $r_1$, while the data code words on the other data drives are protected by corresponding redundancy symbols stored on redundant drives $r_2, r_3, \ldots, r_{n-k}$.

After this first write operation, the system can correctly reproduce all the data code words previously stored in the corresponding sector locations on the other k-1 data drives as long as, as explained in more detail below, no more than $(D-2)-1$, or D-3 drives fail simultaneously. Furthermore, the system can correctly reproduce the newly recorded data code word as long as one of the two drives involved in the write operation is operating properly.

The system can then continue writing to the same sector on various data drives and associated redundant drives without generating new redundancy symbols until the corresponding sectors on $[(n-k)/2]-1$ different data drives have been involved in write operations. At this time, the system can correctly reproduce data code words from the data in these sectors if no more than D-(n-k-2)-1 drives fail simultaneously. At this point, a next write operation to a corresponding sector on another device, if it is performed without generating new redundancy symbols, would essentially eliminate the advantages gained by including in the system the redundant drives. The system could thus reproduce data code words from these sectors using the associated Reed-Solomon code words only if all the drives are operating properly.

As part of its next write operation, therefore, the system (i) retrieves from the corresponding sectors on each of the k data drives the stored data code words, (ii) encodes the corresponding symbols from each retrieved code word to generate, for each set of k symbols, n-k redundancy symbols, and (iii) records the generated symbols on the redundant drives. The stored data code words then have the full protection of the distance D Reed-Solomon code. Alternatively, the system can perform the retrieval and encoding steps in between write operations, when the system is otherwise idle. The system thus avoids slowing down the write operations, and it can then perform write operations in the same amount of time as a system that does not include redundant drives.

BRIEF DESCRIPTION OF THE DRAWINGS

The above and further advantages of the invention may be better understood by referring to the following description in conjunction with the accompanying drawings, in which.

DETAILED DESCRIPTION

Figure 1:
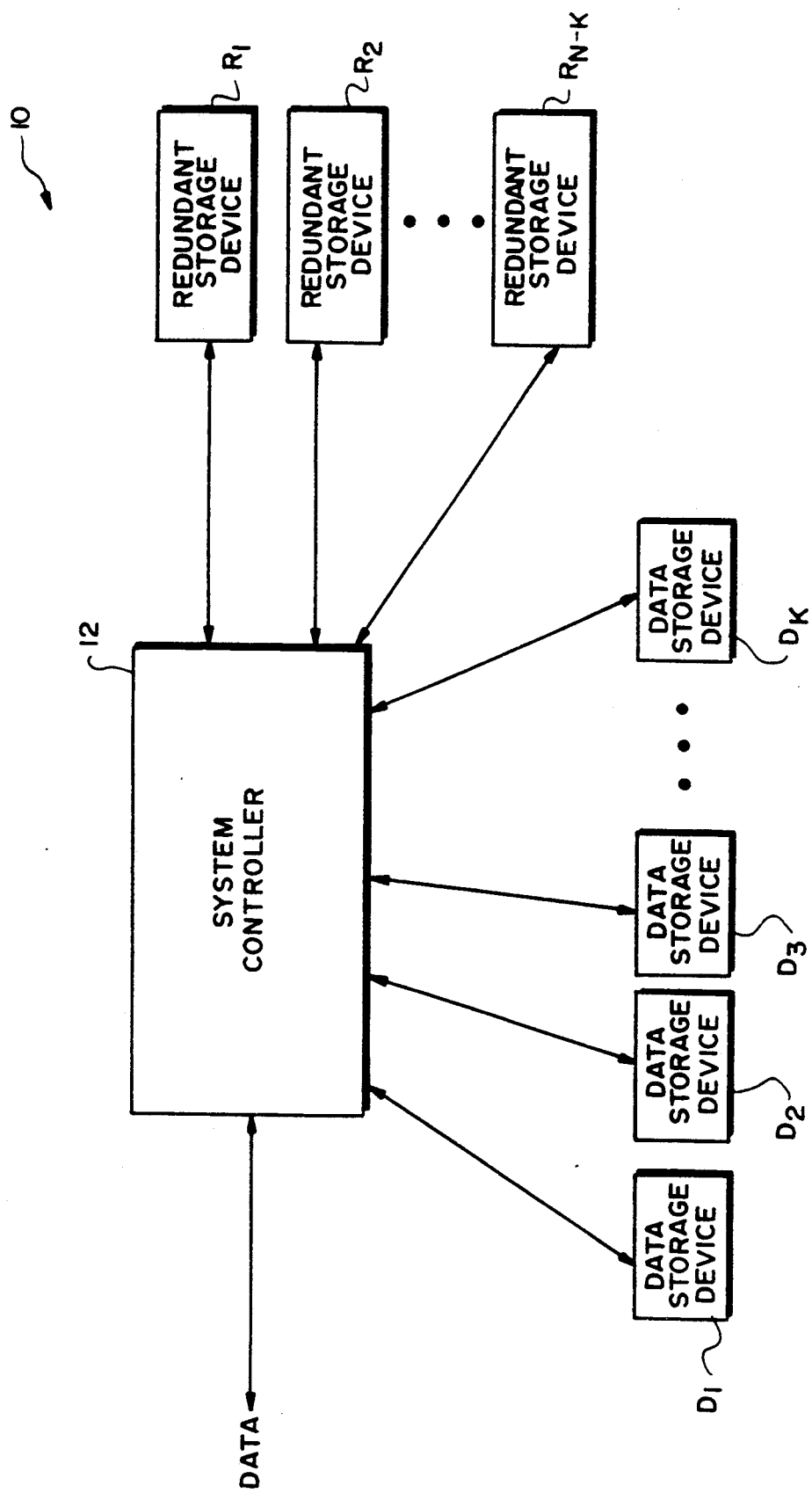
FIG. 1 depicts in block diagram form a data storage system which includes redundant drives.

FIG. 1 depicts a data storage system 10 consisting of a system controller 12, associated data drives $d_1, d_2, \ldots, d_k$ and redundant drives $r_1, r_2, \ldots, r_{n-k}$. The data drives store data code words in each sector and the redundant drives store in the corresponding sectors redundancy symbols which relate to the data code words. The system generates these redundancy symbols by encoding the corresponding data symbols from each of the k data drives using an (n,k) distance D Reed-Solomon code. The symbols stored in the corresponding storage locations on each of the drives, that is, the k symbols stored on the data drives and the n-k symbols stored on the redundant drives, form an n-symbol Reed-Solomon code word.

The system controller performs most write operations by recording the data code words in designated sectors on a designated data drive and, at the same time, recording a copy of the data code words in corresponding storage locations on a designated redundant drive. The system can perform this type of write operation in the same amount of time that it can perform a write operation directed only to a data drive because it simultaneously sends the same data to each of the drives.

Before the data code words are recorded, however, the system controller 12 determines if the data code words must be further encoded as part of the write operation, as described in more detail below with reference to FIG. 2. If the system controller determines that the encoding step is necessary for a particular code word, the controller (i) records the data code word in the designated sector on the designated data drive, (ii) retrieves the stored data code words from the corresponding sector of each of the k data drives, and (iii) encodes the corresponding retrieved data code word symbols the using the (n,k) distance D Reed-Solomon code to generate, for each set of k retrieved symbols, n-k redundancy symbols. The system controller then records the generated redundancy symbols on the various redundant drives, $r_1, r_2, \ldots r_{n-k}$, such that each sector on a given redundant drive, for example, $r_1$, has stored in it the corresponding redundancy symbol, for example, the first redundancy symbol, from each Reed-Solomon code word.

Each set of k data code word symbols and the associated n-k code word redundancy symbols form a code word in the (n,k) Reed-Solomon code. Using these Reed-Solomon code words, the system can determine the values of lost data code word symbols, even if an entire sector of data is lost. The system controller thus retrieves from the other drives the corresponding data code words and redundancy symbols to form, for each lost symbol, the corresponding Reed-Solomon code word. Then, using conventional error correction techniques, the system separately regenerates from each of the Reed-Solomon code words the corresponding lost data code word symbol. If all the data symbols stored on a particular drive are lost, the system similarly regenerates them using the Reed-Solomon code words.

The system uses only n-k redundant drives to protect completely data stored on k data drives. If, for example, the system uses a (22,16) Reed-Solomon code, it can protect data stored on 16 data drives with only 6 redundant drives. Further, since the code has a distance D=6, the system can recover all the stored data code words, even if up to D-1, or 5, drives fail.

As discussed above, the system controller does not include the retrieval and encoding steps in every write operation. Instead, the controller performs up to a predetermined maximum number of write operations between encodings. Each time the controller performs a write operation which does not include the retrieval and encoding steps, the controller simultaneously writes the data to a data drive, for example, $d_5$, and an associated redundant drive, for example, $r_1$. In the preferred embodiment, the system writes the data to corresponding storage locations on the two drives. However, the system could store the copy of the data code word in any location on the redundant drive and use a sector map to associate the two code words.

Each of these write operations overwrites, for each newly recorded data symbol, two symbols in the associated Reed-Solomon code word—one data symbol and one redundancy symbol. Since these overwritten symbols are no longer part of Reed-Solomon code words, the system must treat them as "errors with known locations" when it next uses the Reed-Solomon code words to correct actual errors. Thus the write operations effectively reduce by two the number of actual errors which the Reed-Solomon code can correct using these code words.

The number of symbols which the Reed-Solomon code can correct is directly related to the code distance. Another way of characterizing a reduction in the error correction capabilities of the Reed-Solomon code, therefore, is as a reduction in the effective distance of the code. Thus reducing the number of errors which the code can correct using a particular code word by two translates to reducing the effective distance associated with that code word by two, from D to D-2.

A reduction of the code distance, in turn, affects the ability of the system to reproduce error-free data. Accordingly, after one write operation, the system can reproduce the data stored in this particular sector using the Reed-Solomon code as long as no more than (D-2)-1 drives devices fail simultaneously. In the example, the system can, after one write operation, reproduce the stored data symbols if no more than $(6-2)-1=3$ drives fail simultaneously. The overwritten data are protected by the duplicate data recorded on redundant drive $r_1$, and thus, the system will not lose this data as long as at least one of the $d_5$ or $r_1$ drives is operating properly.

If the system next performs a write operation which is directed to the same sector location on a data drive that has already been involved in a write operation, for example, sector 100 of device $d_5$, the system records the data code word in the designated sector on the data drive and, also, in the corresponding sector on the associated redundant drive $r_1$. This write operation does not further reduce the effective distance of the associated Reed-Solomon code word, however, because it overwrites symbols which the system already treats as erroneous. The system may thus perform an unlimited number of these write operations between encodings.

The system continues to perform write operations without retrieval and encoding steps until the distance of the associated Reed-Solomon code word is reduced below an acceptable minimum. Each write operation directed to the corresponding sector on a data drive which has not previously been involved in a write operation reduces the effective distance of the Reed-Solomon code to (D-2w)-1, where w is the number of data drives involved in the various write operations. The system thus cannot perform such write operations directed to corresponding sectors on more than [(n-k)/2]-1 different data drives, without eliminating the error protection gained by including in the system the redundant drives. If (n-k) is odd, the maximum number of data drives to which write operations may be directed without eliminating the protection offered by the redundant drives is [((n-k)-1)/2]-1.

In the current example, a next write operation to any data drive other than $d_5$ would reduce the effective distance to 1, that is, to (6-4)-1, which renders the system capable of reproducing error-free data using the Reed-Solomon code only if all the drives are operating properly. Since this offers the stored data virtually no protection from a drive failure, the system performs the retrieval and encoding steps as part of this next write operation.

Figure 2:
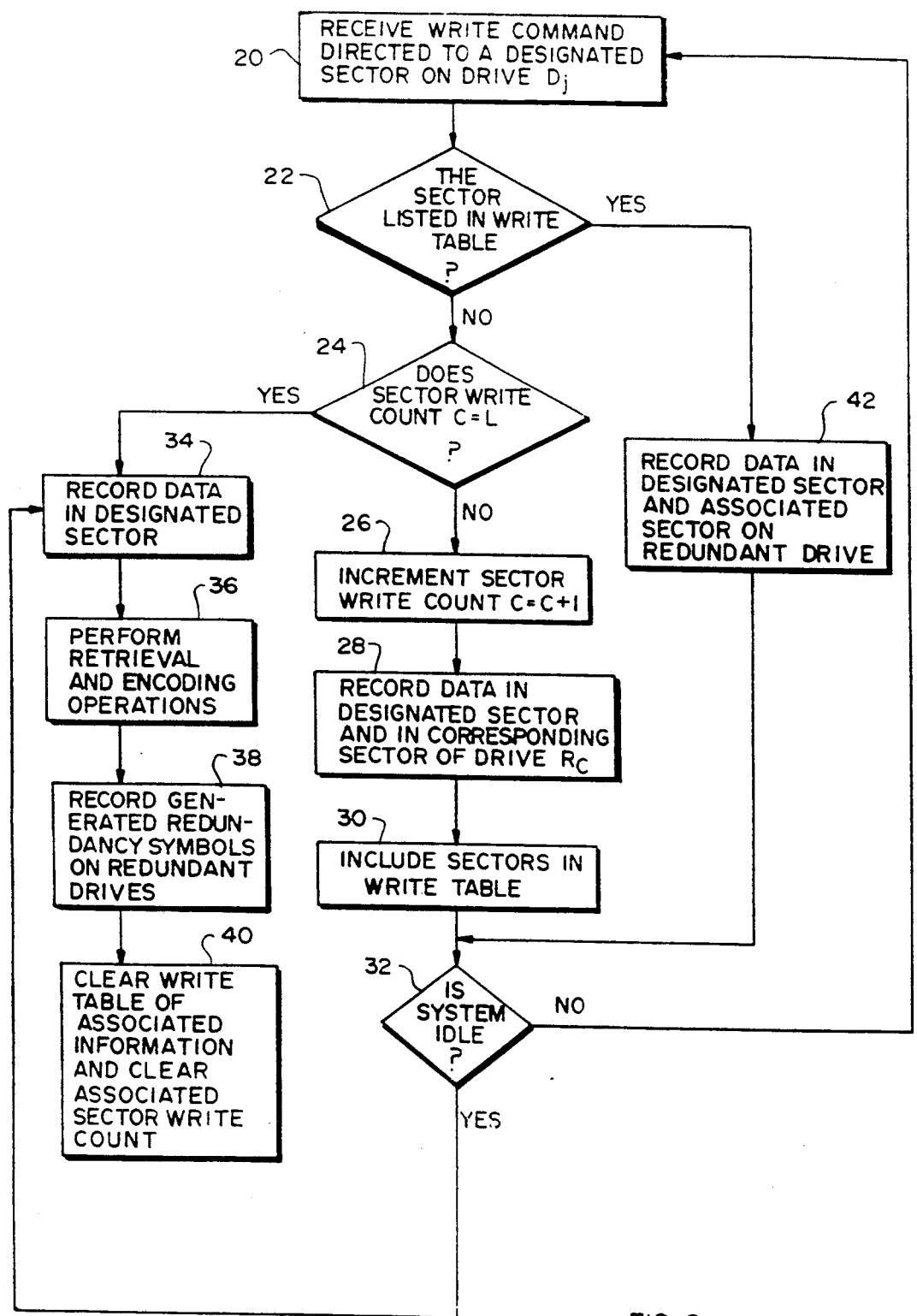
FIG. 2 is a flow chart depicting the steps which a system controller shown in FIG. 1 follows in performing a write operation.
Figure 3:
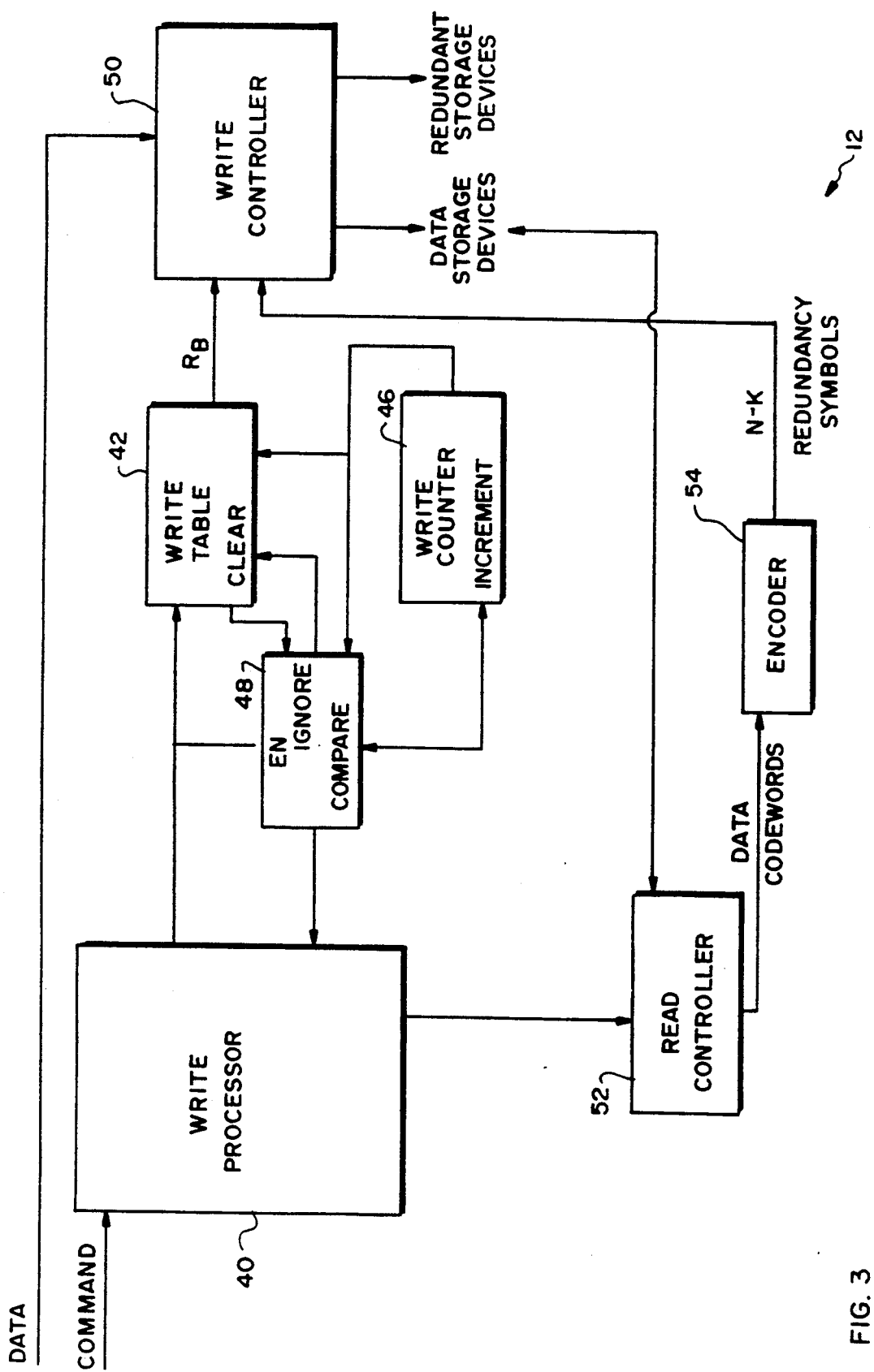
FIG. 3 is a block diagram of the system controller shown in FIG. 1.

The operations of the system controller 12 in determining when to perform the retrieval and encoding steps are set forth in FIG. 2. Referring now to FIG. 2 in conjunction with FIG. 3 which depicts the system controller in more detail, when a write processor 40 receives instructions to perform a write operation over its command line, it sends to write table 42 information which identifies the data drive and the sector to which the write operation is directed, for example, information identifying sector 100 on data drive $d_5$ (steps 20-22). The write table 42 then determines if that particular sector has been involved in a write operation since the previous encoding. If it has, the write table 42 determines which sector on a redundant device was also involved in the operation.

The write table 42 may, for example, consist of k memory locations for each corresponding sector location, with each memory location being addressed by the information identifying the sector and the particular data drive. The memory locations either contain all ZEROS, if the particular sector on the identified data drive has not been involved in a write operation, or information identifying a redundant drive.

If the particular sector has not been involved in a write operation, the write processor 40 directs comparator 48 to compare an associated sector write count, c, in write counter 46 to the predetermined limit. The comparator 48 thus compares c to [(n-k)/2]-1—assuming (n-k) is even (step 24). If the count is less than the limit, which indicates fewer than [(n-k)/2]-1 of the corresponding sectors have been overwritten, the comparator 48 sends to the counter 46 a signal which increments the counter by 1, to c=c+1 (step 26). The processor 40 then directs a data write controller 50 to send the data code word to both sector 100 of data drive $d_5$ and the corresponding sector of redundant drive $r_c$, which is device $r_1$ for this first write operation to the designated sector (step 28).

At the same time, the write processor 40 directs the write table 42 to store information indicating that sector 100 of data drive $d_5$ and the corresponding sector of redundant drive $r_1$ have been involved in the write operation (step 30).

If the write processor 40 receives another write command, it repeats the various steps described above. If the write command directs the write operation to a particular sector which has not been overwritten, the processor directs the comparator 48 to compare the write count for the particular sector to the limit. If the count is below the limit, the processor directs data write controller 50 to send the data code word to both the designated sector and to the corresponding sector of redundant drive $r_c$. It then directs the write table to store information indicating that the designated sector has been overwritten and that the corresponding sector of drive $r_c$ has stored in it the copy of the data code word.

If a next write command directs the write operation to a particular sector that is identified in the write table 42, for example, sector 100 of drive $d_5$, the write table 42 sends to write controller 50 information which identifies the corresponding sector of redundant drive $r_1$. It also sends a signal to comparator 48 which directs it to ignore the count from sector write counter 46. The comparator 48 is thus prevented from directing the write counter 46 to increase its write count for the sector. The write controller 50 next sends the data code words for recording to both data drive $d_5$ and associated redundant drive $r_1$ (step 42). If the write processor 40 has queued another write command, it begins another write operation. Otherwise, the processor 40 becomes idle (step 32).

Assuming the write processor 40 continues to perform write operations, it increases one of its sector write counts each time it directs a write operation to a sector which has not been involved in a write operation since the previous encoding operation. When the processor is directed to perform a write operation which increases the associated sector write count to $[(n-k)/2]-1$, the processor directs the write controller 50 to send the data code words to the appropriate data drive for recording, and then directs the write controller 50 and the read controller 52 to perform retrieve and encode operations (steps 34-36).

The read controller 52 retrieves from the corresponding sectors of data drives $d_1, d_2, \ldots d_k$ the k corresponding data code words. It then sends to an encoder 54 the first data symbol from each of the retrieved code words. The encoder 54 encodes the k data symbols to generate n-k redundancy symbols, and sends the redundancy symbols to write controller 50. Write controller 50, in turn, sends each of the generated symbols to the corresponding redundant drive (step 38).

The read controller 52 sends to the encoder 54 the next symbol from each of the retrieved data code words. The encoder 54 encodes the k received symbols to generate a next set of n-k code word redundancy symbols and sends the generated symbols to the write controller 50. The write controller 50 then directs the generated symbols to the various redundant drives. The read controller 52, encoder 54 and write controller 50 continue their respective retrieval and encoding operations until all the retrieved data code word symbols have been encoded. The respective redundant drives then each record the received redundancy symbols in the corresponding sector. Next, the write processor directs the write counter 46 to reset the associated write count to ZERO and the write table 42 to clear the associated stored information (step 40).

If the write processor 40 becomes idle after performing one or more write operations, it directs read controller 52, encoder 54 and write controller 50 to perform the retrieval, encoding and recording steps described above, regardless of the actual write counts (step 32). In this way, the system avoids having to perform these operations as part of a write operation. The system can then perform, at a minimum, the next $[(n-k)/2]-1$ write operations directed to the corresponding sectors without these relatively time consuming steps.

When the system must regenerate the data stored on a failed drive, it retrieves from each data drive and each redundant drive the corresponding data and redundancy symbols, respectively, and forms for each lost symbol a Reed-Solomon code word. It then treats each of the data and redundant symbols which have been overwritten since the last encoding as errors with known locations, that is, as erasures, and determines the values of the lost data symbols using conventional error correcting techniques. If, however, one or more of the sectors of the failed drive have been overwritten since the last encoding, the system instead retrieves from the drives associated with these sectors the stored copy of the data.

In the example, if the system must regenerate sectors 100 through 103 of drive $d_5$, the system first consults the write table to determine if any of these sectors have been overwritten since the last encoding. It thus determines that sector 100 has been overwritten. Next, it retrieves the copy of this sector stored on redundant drive $r_1$.

The system next regenerates the data stored in sectors 101, 102 and 103. It thus retrieves from the other drives the data stored in the sectors corresponding to these sectors, and again consults the write table to determine if any of these retrieved sectors have been overwritten. If they have, the system replaces the overwritten sectors with all-ZERO symbols. If, for example, sector 103 on drive $d_2$ and the corresponding sector on redundant drive $r_{n-k}$ have been overwritten, the system replaces these sectors with a corresponding number of all-ZERO symbols. If any of the drives have failed the system treats the lost sectors as all-ZERO symbols, also.

The system then forms Reed-Solomon code words from the corresponding symbols of each of the retrieved sectors and the lost sectors. The code words thus each have at least three all-ZERO symbols, one corresponding to each of the overwritten sectors and one corresponding to the lost sector. The system treats these all-ZERO symbols as errors with known locations and, using conventional error correcting techniques, determines a value for each of the symbols of sectors 101, 102 and 103 of drive $d_5$. It then provides to a requester the retrieved copy of sector 100 and the regenerated symbols of sectors 101, 102 and 103.

In summary, the inventive system protects data from loss due to storage device corruption or failure using a relatively small number of redundant drives. It protects the data as long as fewer than D-2w-1 drives fail, and thus, it is robust. Furthermore, the system achieves this robustness without requiring as part of each write operation time consuming data retrieval and encoding steps.

The inventive system may be used on drives with multiple disks to protect the data stored thereon from loss due to the corruption of a particular surface. In such a system, each disk surface is treated as a separate drive.

I claim:

1. A data storage system comprising:
A. k data storage devices, each including a plurality of sectors, with each sector including a plurality of storage locations, the data storage devices storing in each storage location of a sector a data code word symbol;
B. n-k redundant storage devices each including a plurality of sectors, with each sector including a plurality of storage locations, the redundant storage devices storing in each storage location of a sector a redundancy symbol or a data code word symbol;
C. a write controller for controlling write operations directed to the data storage devices and the redundant storage devices;
D. a write counter for maintaining, for each sector, a count of the number of different data storage devices to which a write operation involving a corresponding sector has been directed;
E. an encoder for encoding data code word symbols stored in corresponding storage locations on the k data storage devices using an (n,k) distance D Reed-Solomon code to generate for each set of k data symbols n-k redundancy symbols;
F. the write controller directing a data storage device to store a data code word in a particular sector and further
   i. directing a selected redundant storage device to store the same data code word in a corresponding sector if the count associated with the sector to which the data code word is directed is below a predetermined value,
   ii. otherwise, if the count associated with the particular sector is equal to the predetermined value, directing the encoder to encode the data code word symbols stored in corresponding sectors on each of the data storage devices and directing each of the redundant storage devices to store the redundancy symbols produced by the encoder in the corresponding storage locations.

2. The data storage system of claim 1 further including a write table for storing information identifying the redundant storage device selected to store the same data code word that is stored in a sector of a particular data storage device.

3. The data storage system of claim 1, wherein the encoder further encodes the stored data when the write count is greater than zero and the write controller is otherwise idle.

4. The data storage system of claim 1, wherein the write controller directs each of the redundant storage devices to store in a corresponding storage location a single one of the n-k redundancy symbols.

5. The data storage system of claim 1, wherein the redundant storage devices store the n-k redundancy symbols in storage locations corresponding to the associated data symbols.

6. The data storage system of claim 1, wherein the storage system further includes means for correcting errors in data code words, the means including:
A. retrieving means for retrieving from the data storage devices and the redundant storage devices, respectively, symbols which correspond to the erroneous symbols in a data code word;
B. error correcting means for (i) producing from the retrieved symbols Reed-Solomon code words which correspond to the erroneous data code word symbols, (ii) treating as erasures the symbols in each Reed-Solomon code word which are from sectors which have been overwritten since the previous encoding, and (iii) manipulating the Reed-Solomon code words to determine the value of the erroneous data code word symbols.

7. The data storage system of claim 1, wherein the storage system further includes error correcting means for regenerating lost data code words, the error correcting means including:
A. retrieving means for retrieving from the data storage devices and the redundant storage devices, respectively, symbols which correspond to the lost data code word symbols;
B. error correcting means for (i) producing from the retrieved symbols Reed-Solomon code words which correspond to the lost data code word symbols, (ii) treating as erasures the symbols in each Reed-Solomon code word which are from sectors which have been overwritten since the previous encoding, and (iii) manipulating the Reed-Solomon code words to determine the value of the lost data code word symbols.

8. The data storage system of claim 7, wherein the error correcting means further includes means for correcting errors in the stored data code words.

9. The data storage system of claim 7, wherein the write counter increments the count associated with a particular sector when the write controller directs a write operation to a corresponding sector which contains a data code word which has been included by the encoder in a previous encoding operation.

10. A method for operating a data storage system which includes k data storage devices and n-k redundant storage devices which each have a plurality of sectors for data storage, the method including the steps of:
A. receiving a write command;
B. determining if a particular sector of a data storage device to which the write command is directed has been involved in a write operation since a previous encoding operation;
C. if the particular sector has not been involved in a write operation since the previous encoding operation, determining how many write operations have been directed to corresponding sectors on other data storage devices, and
   i. if fewer than a predetermined number of write operations have been performed, recording the data both in the particular sector and in a corresponding sector on a selected redundant storage device;
   ii. if the predetermined number of write operations has been performed,
      a. recording the data in the particular sector,
      b. performing an encoding operation by retrieving data stored in the particular sector and in the corresponding sectors on each of the data storage devices and enclosing corresponding symbols of the data to form n-k redundancy symbols, and
      c. storing the redundancy symbols in corresponding storage locations on the redundant storage devices, D. if the particular storage location has been involved in a write operation since the previous encoding, recording the data in both the particular sector and in the corresponding sector on the redundant storage device selected for sue in the previous write operation directed to the particular sector;

E. repeating steps B-D each time a write command is received.

11. The method of claim 10, further including the steps of:

F. determining if a write command is being received or processed; and

G. if not, repeating step C for each sector involved in at least one write operation since a previous encoding operation;

H. repeating steps B-D whenever a write command is receive.

12. The method of claim 10, wherein said method further includes the step of regenerating lost symbols by:

i. retrieving from the data storage devices and the redundant storage devices, respectively, symbols which correspond to the lost symbols in a data code word;

ii. producing from the retrieved symbols Reed-Solomon code words which correspond to the lost data code word symbols, iii. treating as erasures the symbols in the Reed-Solomon code word which are form sectors which have been over written since the previous encoding, and iv. manipulating the Reed-Solomon cod words to determine the value of the lost data code word symbols.

13. The method of claim 10, wherein said method further includes the step of correcting lost or erroneous symbols by:

i. retrieving from the data storage devices and the redundant storage devices, respectively, symbols which correspond to the erroneous or lost symbols in a data code word;

ii. producing from the retrieved symbols Reed-Solomon code words which correspond to the erroneous data code word symbols, iii. treating as erasures the symbols in the Reed-Solomon code word which are form sectors which have been over-written since the previous encoding, and iv. manipulating the Reed-solomon code words to determine the value of the erroneous or data code word symbols.

* * * * *